US009111916B2

United States Patent
Roy et al.

(10) Patent No.: US 9,111,916 B2
(45) Date of Patent: Aug. 18, 2015

(54) IN SITU-BUILT PIN-GRID ARRAYS FOR CORELESS SUBSTRATES, AND METHODS OF MAKING SAME

(71) Applicant: Intel Corporation, Santa Clara, CA (US)

(72) Inventors: Mihir K. Roy, Chandler, AZ (US); Mathew J. Manusharow, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/194,936

(22) Filed: Mar. 3, 2014

(65) Prior Publication Data

US 2014/0179060 A1  Jun. 26, 2014

Related U.S. Application Data

(62) Division of application No. 13/174,109, filed on Jun. 30, 2011.

(51) Int. Cl.
*H01L 21/00* (2006.01)
*H01L 21/48* (2006.01)
(Continued)

(52) U.S. Cl.
CPC ...... *H01L 21/4857* (2013.01); *H01L 23/49811* (2013.01); *H01L 23/49822* (2013.01); *H01L 23/50* (2013.01); *H01L 25/18* (2013.01); *H01L 25/50* (2013.01); *H05K 3/4007* (2013.01); *H05K 3/4682* (2013.01); *H01L 24/16* (2013.01); *H01L 24/32* (2013.01); *H01L 24/48* (2013.01); *H01L 2224/13099* (2013.01); *H01L 2224/16227* (2013.01); *H01L 2224/32225* (2013.01); *H01L 2224/48227* (2013.01);
(Continued)

(58) Field of Classification Search
CPC .. H05K 3/4682; H01L 25/50; H01L 21/4857; H01L 23/50; H01L 23/49822; H01L 23/49811; H01L 25/18
USPC .................................................. 438/107, 125
See application file for complete search history.

(56) References Cited

U.S. PATENT DOCUMENTS 4,930,002 A   5/1990  Takenaka et al.
6,534,854 B1  3/2003  Fazelpour et al.
(Continued)

FOREIGN PATENT DOCUMENTS

EP   0285064 A2  10/1988
EP   2309535 A1   4/2011
(Continued)

OTHER PUBLICATIONS

International Search Report and Written Opinion Received for PCT Application No. PCT/US2012/044744, Mailed on Jan. 21, 2013, 14 pages.
(Continued)

*Primary Examiner* — Benjamin Sandvik
*Assistant Examiner* — Farid Khan
(74) *Attorney, Agent, or Firm* — John N. Greaves

(57) ABSTRACT

A coreless pin-grid array (PGA) substrate includes PGA pins that are integral to the PGA substrate without the use of solder. A process of making the coreless PGA substrate integrates the PGA pins by forming a build-up layer upon the PGA pins such that vias make direct contact to pin heads of the PGA pins.

3 Claims, 8 Drawing Sheets

(51) Int. Cl.
  *H01L 23/498*  (2006.01)
  *H01L 23/50*   (2006.01)
  *H01L 25/18*   (2006.01)
  *H01L 25/00*   (2006.01)
  *H05K 3/46*    (2006.01)
  *H05K 3/40*    (2006.01)
  *H01L 23/00*   (2006.01)
  *H05K 3/00*    (2006.01)

(52) U.S. Cl.
  CPC ........... *H01L 2224/73204* (2013.01); *H01L 2224/73265* (2013.01); *H01L 2225/06513* (2013.01); *H01L 2225/06517* (2013.01); *H01L 2225/06541* (2013.01); *H01L 2225/1023* (2013.01); *H01L 2225/1058* (2013.01); *H05K 3/007* (2013.01); *H05K 2203/0769* (2013.01)

(56) References Cited

U.S. PATENT DOCUMENTS

| | | | |
|---|---|---|---|
| 8,110,754 B2 | 2/2012 | Asano | |
| 8,120,166 B2 | 2/2012 | Koizumi et al. | |
| 2005/0230841 A1 | 10/2005 | Walk et al. | |
| 2008/0296752 A1* | 12/2008 | Nakajima | 257/697 |
| 2009/0052150 A1 | 2/2009 | Kobayashi | |
| 2009/0242262 A1* | 10/2009 | Asano | 174/267 |
| 2009/0250824 A1 | 10/2009 | Qi et al. | |
| 2009/0288870 A1* | 11/2009 | Kondo et al. | 174/261 |
| 2010/0237462 A1 | 9/2010 | Beker et al. | |
| 2011/0147933 A1 | 6/2011 | Wu et al. | |
| 2011/0147951 A1 | 6/2011 | Murayama et al. | |
| 2011/0176286 A1* | 7/2011 | Nakajima et al. | 361/783 |
| 2011/0304016 A1 | 12/2011 | Nakamura et al. | |
| 2011/0304051 A1 | 12/2011 | Touzelbaev et al. | |
| 2011/0308849 A1 | 12/2011 | Kondo et al. | |
| 2011/0316148 A1 | 12/2011 | Kondo et al. | |
| 2012/0018194 A1 | 1/2012 | Maeda et al. | |
| 2012/0043539 A1 | 2/2012 | Prejean et al. | |
| 2012/0061852 A1 | 3/2012 | Su et al. | |
| 2012/0061853 A1 | 3/2012 | Su et al. | |
| 2012/0073131 A1 | 3/2012 | Miyazawa | |
| 2012/0074581 A1 | 3/2012 | Guzek et al. | |
| 2012/0161316 A1 | 6/2012 | Gonzalez et al. | |
| 2012/0161331 A1 | 6/2012 | Gonzalez et al. | |
| 2012/0234589 A1* | 9/2012 | Furuichi et al. | 174/261 |
| 2012/0273947 A1 | 11/2012 | Mo | |
| 2013/0049229 A1 | 2/2013 | Su | |

FOREIGN PATENT DOCUMENTS

| | | |
|---|---|---|
| WO | 20131003651 A2 | 1/2013 |
| WO | 20131003651 A3 | 3/2013 |

OTHER PUBLICATIONS

International Preliminary Report on Patentability received for PCT Patent Application No. PCT/US2012/044744, mailed on Jan. 16, 2014, 11 pages.

* cited by examiner

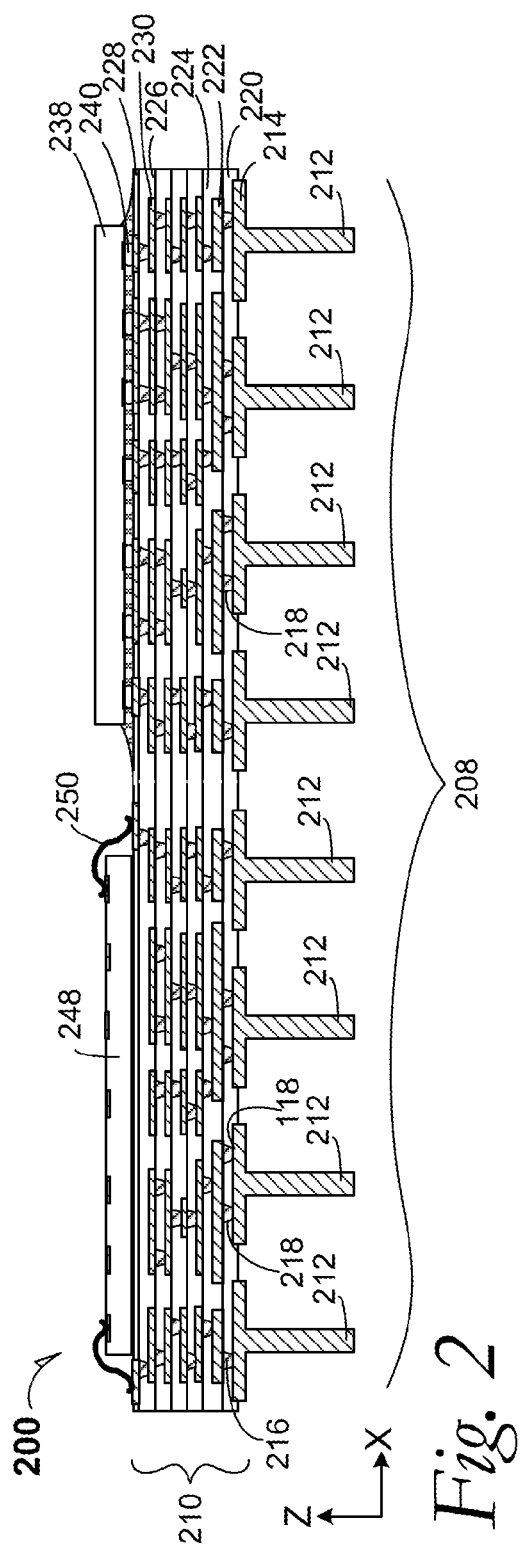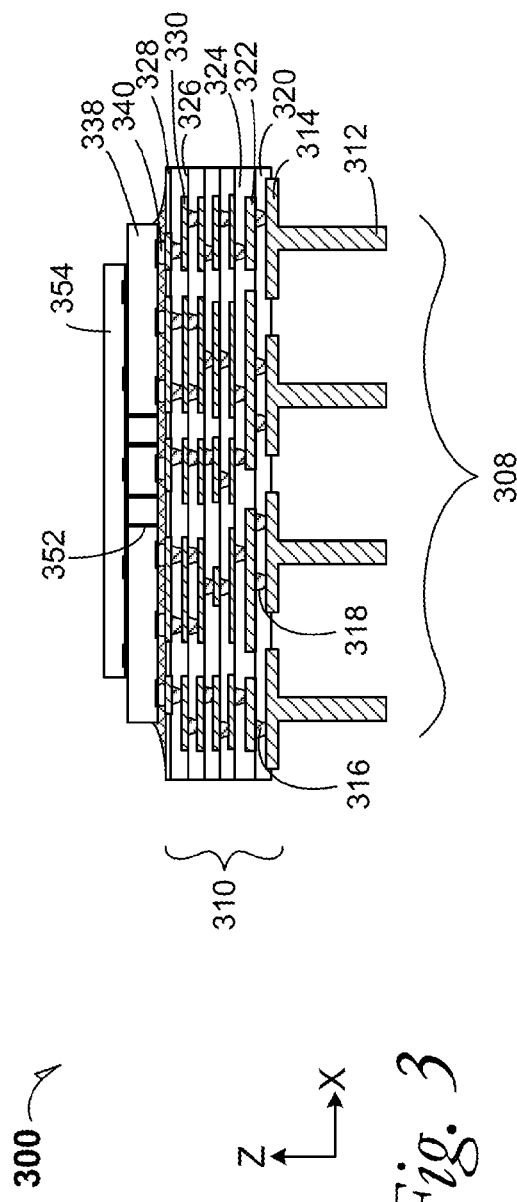

IN SITU-BUILT PIN-GRID ARRAYS FOR CORELESS SUBSTRATES, AND METHODS OF MAKING SAME

CROSS-REFERENCE TO RELATED APPLICATIONS

This application is a divisional of U.S. application Ser. No. 13/174,109, entitled "IN SITU-BUILT PIN-GRID ARRAYS FOR CORELESS SUBSTRATES, AND METHODS OF MAKING SAME" filed Jun. 30, 2011.

TECHNICAL FIELD

Disclosed embodiments relate to pin-grid array substrates.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 2 is a cross-section elevation of a multi-chip package including a coreless pin-grid array substrate with integral pins according to an example embodiment;

FIG. 3 is a cross-section elevation of a stacked-chip package including a coreless pin-grid array substrate with integral pins according to an example embodiment;

DETAILED DESCRIPTION

Processes are disclosed where coreless pin-grid array substrates are assembled and coupled with microelectronic devices as chip packages.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated chip substrates, alone or in chip packages, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1:
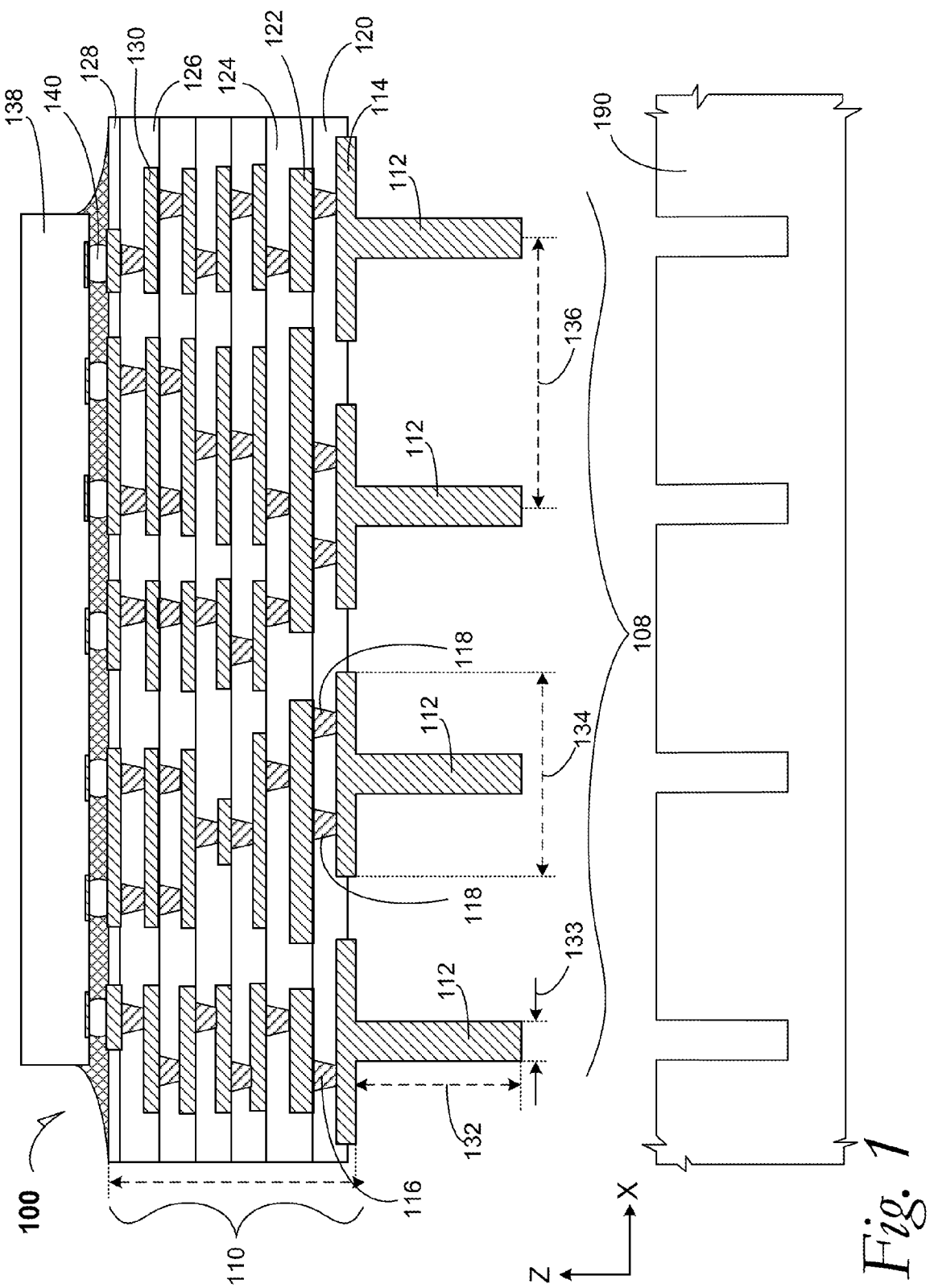
FIG. 1 is a cross-section elevation of a coreless pin-grid array substrate with integral pins according to an example embodiment.

FIG. 1 is a cross-section elevation of a coreless pin-grid array (PGA) substrate 110 with integral pins as a chip package 100 according to an example embodiment. It may be understood that "integral pins" means the PGA pins are formed in situ with the coreless PGA substrate 110.

A coreless PGA substrate 110 is depicted with a plurality of pins 112. The pins 112 include pin heads 114. As a unit the pins 112 and pin heads 114 are part of the PGA substrate 110 such that the PGA substrate 110 has been manufactured to be an integral structure that includes the pins 112. Expressed another way, no solder is used to couple the pins 112 to the coreless PGA substrate 110. During manufacture of the coreless PGA substrate 110, the pins 112 are fabricated to be an integral part of thereof. The pin heads 114 are also the pads 114 of the PGA although they are integral to the pins 112.

As depicted, the pins 112 including the pin heads 114 are attached to the coreless PGA substrate 110 through signal vias 116 as well as power-ground vias 118. The signal vias 116 are in direct contact with the pin heads 114. Similarly, the power-ground vias 118 are also in direct contact with the pin heads 114. "Direct contact" means in this disclosure that the pins 116 have no intermediary electrical structure such as solder between the vias 116 and 118 and the pin heads 114.

In an embodiment, the power-ground vias 118 are configured as a plurality for a given pin head 114 such as two each for a given pin head. This is in contrast to the signal vias 116 which are configured as a single via for a given pin head. In other words, the number of signal vias for a given pin head is smaller than the number of power-ground vias for a given pin head. As illustrated in an embodiment, the signal via 116 is a single via for a given pin and the power-ground via 118 is more than the number of signal vias. For example in an embodiment, the signal via 116 is a single via for a given pin and the power-ground via 118 for a given pin is one more in number than the number of signal vias. Expressed differently in an embodiment, the number of power-ground vias per pin head is double the number of signal vias per pin head.

A first interlayer 120 encloses the signal- and power/ground vias 116 and 118, respectively, as well as integrates the pin heads 114 therewithin at a pin side of the coreless PGA substrate 110. The pin side is also referred to as the land side as the PGA interfaces with a foundation substrate such as a motherboard. The coreless PGA substrate 110 is further fabricated at the pins 112 and pin heads 114 with a plurality of traces, one of which is indicated with reference numeral 122. The trace 122 may be referred to as a first-level trace 122 because it is in contact with the first interlayer 120. A second interlayer 124 is manufactured abutting the first interlayer 120. Further build-up of the PGA substrate 110 continues until a subsequent interlayer 126 and a solder mask 128 form a portion of a die side thereof. A subsequent trace 130 is in contact with the subsequent interlayer 126. In an embodiment, the number of layers from the first interlayer 120 to the subsequent interlayer 126 is in a range from 2 to 15. In an embodiment, the number of layers from the first interlayer 120 to the subsequent interlayer 126 is in a range from 3 to 9. Several qualities and quantities are disclosed for the coreless PGA substrate embodiments. In an embodiment, each pin 112 of the PGA 108 has a pin length 132 as well as a pinhead width 134. Any two adjacent pins 112 are spaced apart on a center 136.

The PGA substrate 110 and the PGA 108 are configured as a chip package 100 that supports a microelectronic device 138 such as a processor manufactured by Intel Corporation of Santa Clara, Calif. The microelectronic device 138 may be configured as a flip-chip 138 and coupled to the coreless PGA substrate 110 by a plurality of electrical bumps, one of which is indicated with reference numeral 140.

In an embodiment, the PGA substrate 110 has a thickness in a range from 0.200 micrometer (μm) to 0.8 μm In an embodiment, the PGA substrate 110 has a thickness of 0.7 μm. Other thicknesses may be used.

"Pin-pull strength" is defined as the pulling force imposed upon one pin 112 until it fails, which means until it tears away from the coreless substrate 110. In an embodiment, pin-pull strength is in a range from 3 kg to 10 kg. In an embodiment, pin-pull strength is 5 kg. In an embodiment for a 2-via example with a via diameter of 60 μm, the pin-pull strength is greater than 5 kg such as 10 kg.

According to the disclosed embodiments, pin pitch 136 is reduced from conventional technology. In an embodiment, pin pitch 136 is in a range from 350 μm (center-to-center) to 800 μm. In an embodiment, pin pitch 136 is in a range from 400 μm to 550 μm. In an embodiment, pin pitch 136 is in a range from 450 μm to 500 μm.

According to disclosed embodiments, pin length 132 is reduced from conventional technology. In an embodiment, pin length 132 is in a range from 0.6 mm to 1.4 mm. In an embodiment, pin length 132 is in a range from 0.8 mm to 1.2 mm. In an embodiment, pin length 132 is 1 mm. In an embodiment, pin aspect ratio of length 132 divided by width 133 is in a range from 5:1 to 20:1.

In an embodiment, the coreless PGA substrate 110 is assembled as a chip package 100 to a mobile system such as a laptop or netbook computer. A foundation substrate 190 is depicted into which the pins 112 are insertable. In an embodiment, the foundation substrate 190 is a board that is part of a blade server. In an embodiment, the foundation substrate 190 is a board that is part of micro server. In an embodiment, the foundation substrate 190 is a board such as a motherboard for a mobile computer such as a tablet.

Figure 1A:
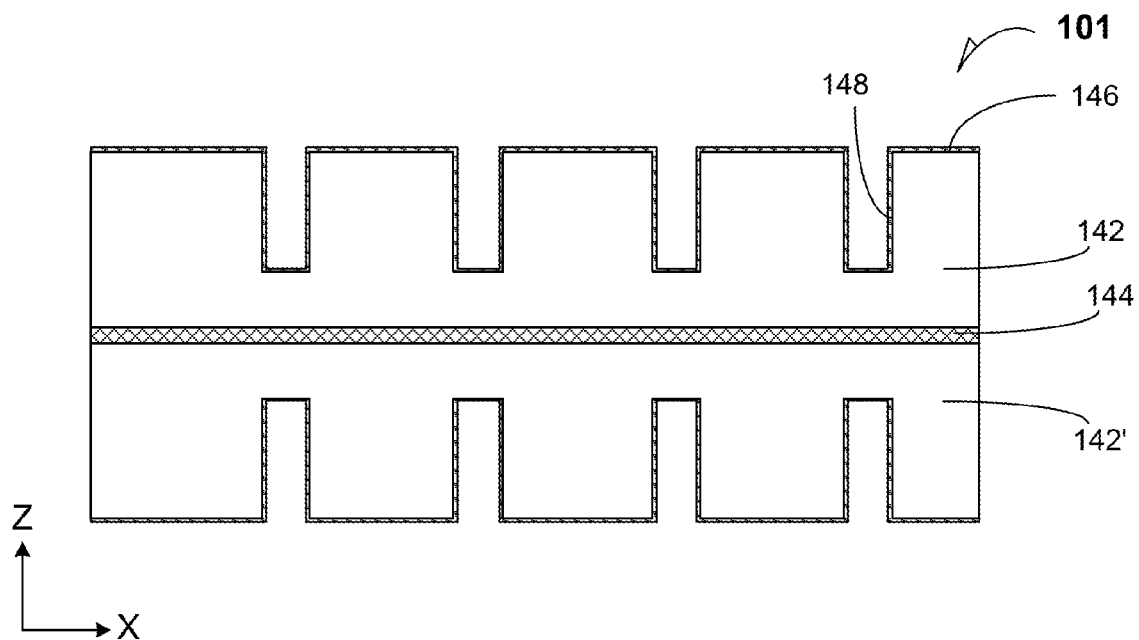
FIG. 1a is a cross-section elevation of the coreless pin-grid array substrate depicted in FIG. 1 during processing according to an example embodiment.

FIG. 1a is a cross-section elevation of the coreless pin-grid array substrate 110 depicted in FIG. 1 during processing according to an example embodiment. A precursor structure 101 is configured with a PGA pin mold 142. The PGA pin mold 142 may be laid up against a similar PGA pin mold 142' for manufacturing utility. The PGA pin mold 142 and the similar PGA pin mold 142' may be attached by a release layer 144 that in later processing is used to separate discrete PGA coreless substrates. Further processing will refer to the coreless PGA substrate that is fabricated by use of the PGA pin mold 142, but processing for the similar PGA pin mold 142' may be inferred.

In an embodiment, the PGA pin mold 142 is processed by an electroless method to adhere a seed layer 146 thereupon. The PGA pin mold 142 includes a plurality of pin recesses, one of which is indicated with reference numeral 148. The seed layer 146 covers the PGA pin mold 142 into the recesses 148. Spacing of the several recesses 148 is configured to accommodate a useful design such as any embodiment described herein for the structure depicted in FIG. 1 and elsewhere in this disclosure. In an example embodiment, a pin pitch 134 of 500 μm is established by the selected PGA pin mold 142.

Figure 1B:
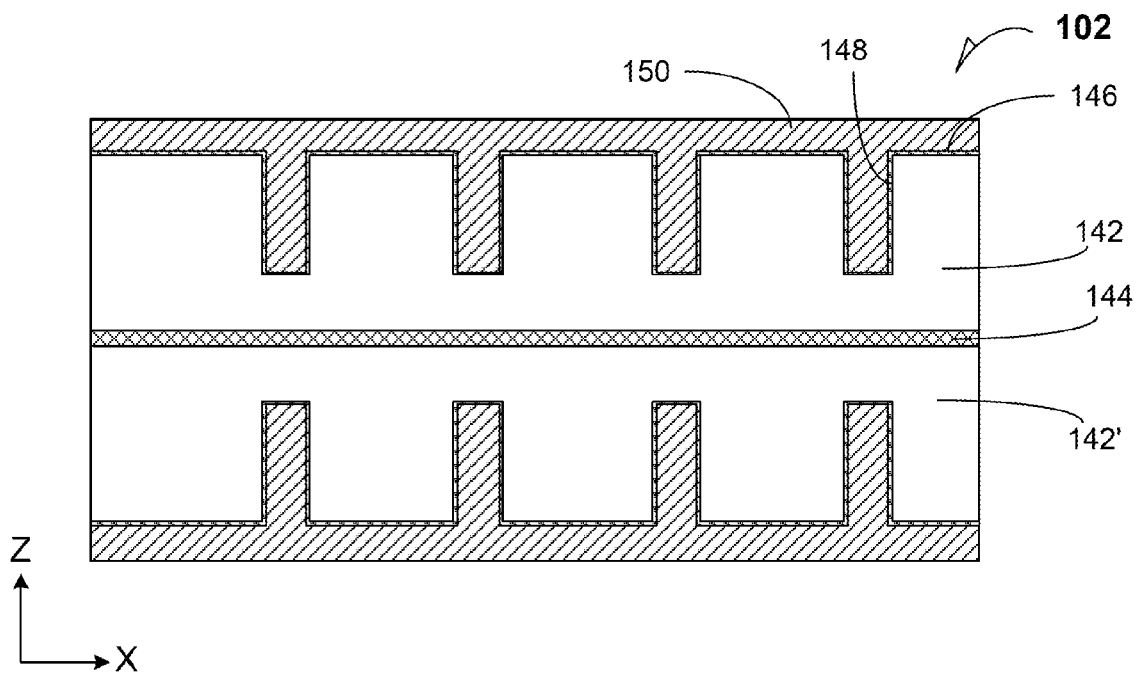
FIG. 1b is a cross-section elevation of the coreless pin-grid array substrate depicted in FIG. 1a during processing according to an example embodiment.

FIG. 1b is a cross-section elevation of the coreless pin-grid array substrate depicted in FIG. 1a during processing according to an example embodiment. The precursor structure 102 includes the PGA pin mold 142 which has been processed by electroplating a pin-grid array precursor film 150 by use of the seed layer 146 as a cathode. In an embodiment, the seed layer 146 is electrical-grade copper and the PGA precursor film 150 is also electrical-grade copper.

Figure 1C:
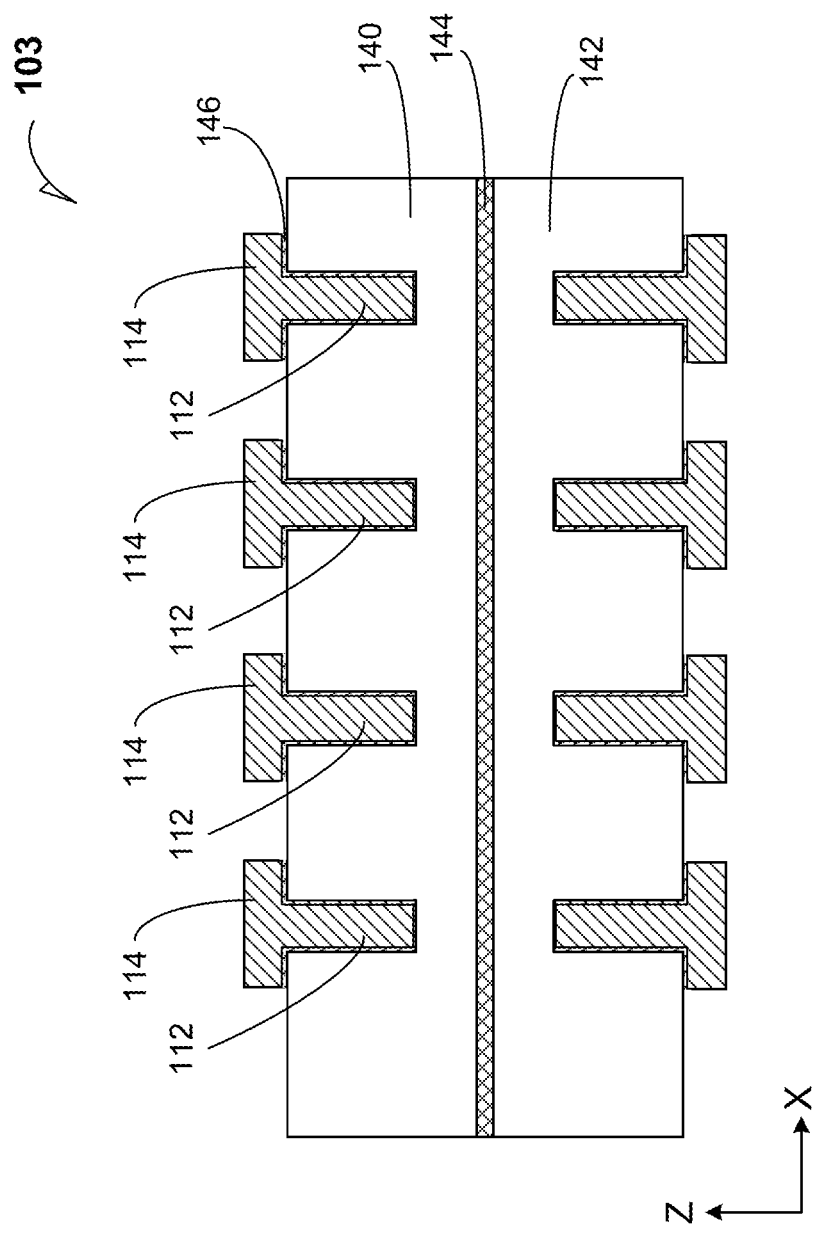
FIG. 1c is a cross-section elevation of the coreless pin-grid array substrate depicted in FIG. 1b during processing according to an example embodiment.

FIG. 1c is a cross-section elevation of the coreless pin-grid array substrate depicted in FIG. 1b during processing according to an example embodiment. The precursor structure 103 includes the PGA substrate 142 has been processed to form individual spaced-apart pins 112 by etching a pattern into the PGA precursor film 150. Processing also forms pin heads 114 as part of the pins 112.

Figure 1D:
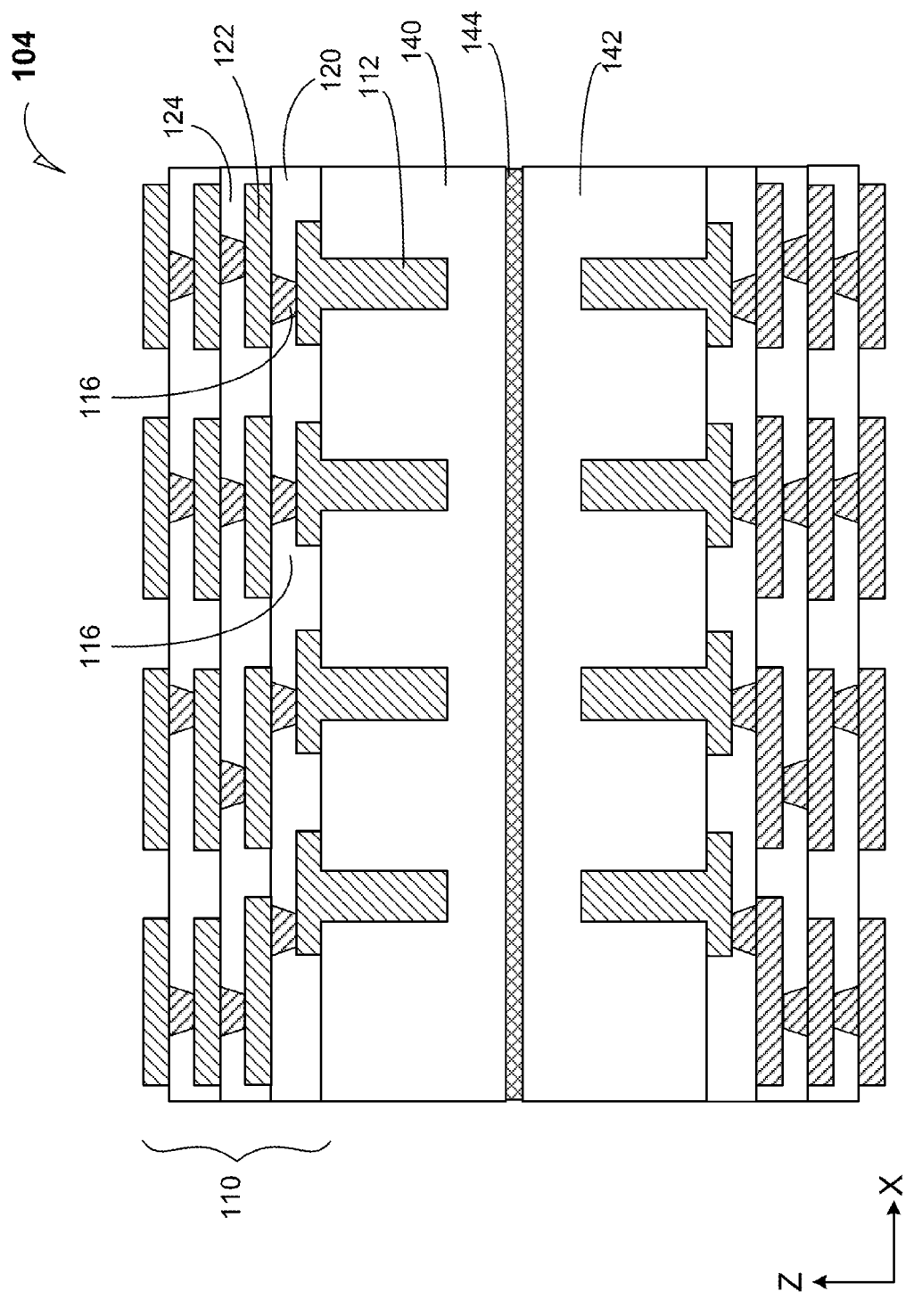
FIG. 1d is a cross-section elevation of the coreless pin-grid array substrate depicted in FIG. 1c during processing according to an example embodiment.

FIG. 1d is a cross-section elevation of the coreless pin-grid array substrate depicted in FIG. 1c during processing according to an example embodiment. Two opposed PGA substrates 104 have been formed by a series of build-up layers, including the PGA substrate 110, shown during intermediate processing in FIG. 1d. As depicted, the pins 112 have been covered with a first interlayer 120 into which the signal- and power/ground vias 116 and 118, respectively, have been formed. The first interlayer 120 also integrates the pin heads 114 therewithin. The PGA substrate 110 is further fabricated at the pins 112 and pin heads 114 with a plurality of first-level traces, one of which is indicated with reference numeral 122. A second interlayer 124 is manufactured abutting the first interlayer 120. Further build-up of the PGA substrate 100 continues until a subsequent interlayer 126 (FIG. 1) and a solder mask 128.

In an embodiment, each pin 112 of the PGA 108 has a pin length 132 as well as a pinhead width 133. Any two adjacent pins are spaced apart on a center 136. The PGA substrate 100 and the PGA 108 are configured as a chip package that supports a microelectronic device 138. The microelectronic device 138 may be configured as a flip-chip 138 and coupled to the coreless PGA substrate 110 by a plurality of electrical bumps, one of which is indicated with reference numeral 140.

FIG. 2 is a cross-section elevation of a multi-chip package 200 including a coreless pin-grid array substrate 210 with integral pins according to an example embodiment. A coreless PGA substrate 210 is depicted with a plurality of pins 212. The pins 212 include pin heads 214. As a unit the pins 212 and pin heads 214 are part of the PGA substrate 210 such that the PGA substrate 210 has been manufactured to be an integral structure that includes the pins 212. Expressed another way, no solder is used to couple the pins 212 to the coreless PGA substrate 210. During manufacture of the coreless PGA substrate 210, the pins 212 are fabricated to be an integral part of thereof. As depicted, the pins 212 including the pin heads 214 are attached to the coreless PGA substrate 210 through signal vias 216 as well as power-ground vias 218 similar to the disclosures for the chip package 110 depicted in FIG. 1A first interlayer 220 encloses the signal- and power/ground vias 216 and 218, respectively, as well as integrates the pin heads 214 therewithin at a pin side of the coreless PGA substrate 210. The coreless PGA substrate 210 is further fabricated at the pins 212 and pin heads 214 with a plurality of traces, one of which is indicated with reference numeral 222. The trace 222 may be referred to as a first-level trace 222 because it is in contact with the first interlayer 220. A second interlayer 224 is manufactured abutting the first interlayer 220. Further build-up of the PGA substrate 210 continues until a subsequent interlayer 226 and a solder mask 228 form a portion of a die side thereof. A subsequent trace 230 is in contact with the subsequent interlayer 226.

The PGA substrate 210 and the PGA 208 are configured as a multi-chip package 200 that supports the microelectronic device 238 such as a processor manufactured by Intel Corporation of Santa Clara, Calif., as well as a subsequent microelectronic device 248. In an embodiment, the microelectronic device 238 is a flip-chip 238 and coupled to the coreless PGA substrate 210 by a plurality of electrical bumps, one of which is indicated with reference numeral 240, and the subsequent microelectronic device 248 is a wire-bond 250 chip that mounted with the active surface facing away from the die side of the coreless PGA substrate 210. In an embodiment, the device 238 is a processor and the device 248 is a radio-frequency device. In an embodiment, both chips are flip-chip mounted like the microelectronic device 238.

It may now be understood that coreless-substrate qualities depicted and described for the coreless substrate 110 depicted in FIG. 1 may be applied to the multi-chip package coreless PGA substrate 210. It may now be understood that the coreless PGA substrate 210 may interface with a foundation substrate such as the foundation substrate 190 embodiments illustrated and described in FIG. 1.

FIG. 3 is a cross-section elevation of a stacked-chip package 300 including a coreless pin-grid array substrate 310 with integral pins according to an example embodiment. A coreless PGA substrate 310 is depicted with a plurality of pins 312. The pins 312 include pin heads 314. As a unit the pins 312 and pin heads 314 are part of the PGA substrate 310 such that the PGA substrate 310 has been manufactured to be an integral structure that includes the pins 312. Expressed another way, no solder is used to couple the pins 312 to the coreless PGA substrate 310. During manufacture of the coreless PGA substrate 310, the pins 312 are fabricated to be an integral part of thereof. As depicted, the pins 312 including the pin heads 314 are attached to the coreless PGA substrate 310 through signal vias 316 as well as power-ground vias 318 similar to the disclosures for the chip package 310 depicted in FIG. 1 and the multi-chip package 200 that includes the coreless PGA substrate 210 depicted in FIG. 2. A first interlayer 320 encloses the signal- and power/ground vias 316 and 318, respectively, as well as integrates the pin heads 314 therewithin at a pin side of the coreless PGA substrate 310. The coreless PGA substrate 310 is further fabricated at the pins 312 and pin heads 314 with a plurality of traces, one of which is indicated with reference numeral 322. The trace 322 may be referred to as a first-level trace 322 because it is in contact with the first interlayer 320. A second interlayer 324 is manufactured abutting the first interlayer 320. Further build-up of the PGA substrate 310 continues until a subsequent interlayer 326 and a solder mask 328 form a portion of a die side thereof. A subsequent trace 330 is in contact with the subsequent interlayer 326.

The PGA substrate 310 and the PGA 308 are configured as a stacked-chip package 300 that supports the microelectronic device 338 such as a processor manufactured by Intel Corporation of Santa Clara, Calif., as well as a stacked subsequent microelectronic device 348. In an embodiment, the microelectronic device 338 is a through-silicon via 352 flip-chip 338 and coupled to the coreless PGA substrate 310 by a plurality of electrical bumps, one of which is indicated with reference numeral 340, and the subsequent microelectronic device 354 is a flip-chip 354 that is mounted with the active surface facing toward from the die side of the coreless PGA substrate 310 and coupled to the TSVs 352. In an embodiment, the device 338 is a processor and the device 348 is a memory device such as a solid-state drive. It may now be understood that coreless-substrate qualities depicted and described for the coreless substrates 110 and 210 depicted in FIGS. 1 and 2 may be applied to the stacked-chip package coreless PGA substrate 310 and vice versa. It may now be understood that the coreless PGA substrate 310 may interface with a foundation substrate such as the foundation substrate 190 embodiments illustrated and described in FIG. 1.

Figure 4:
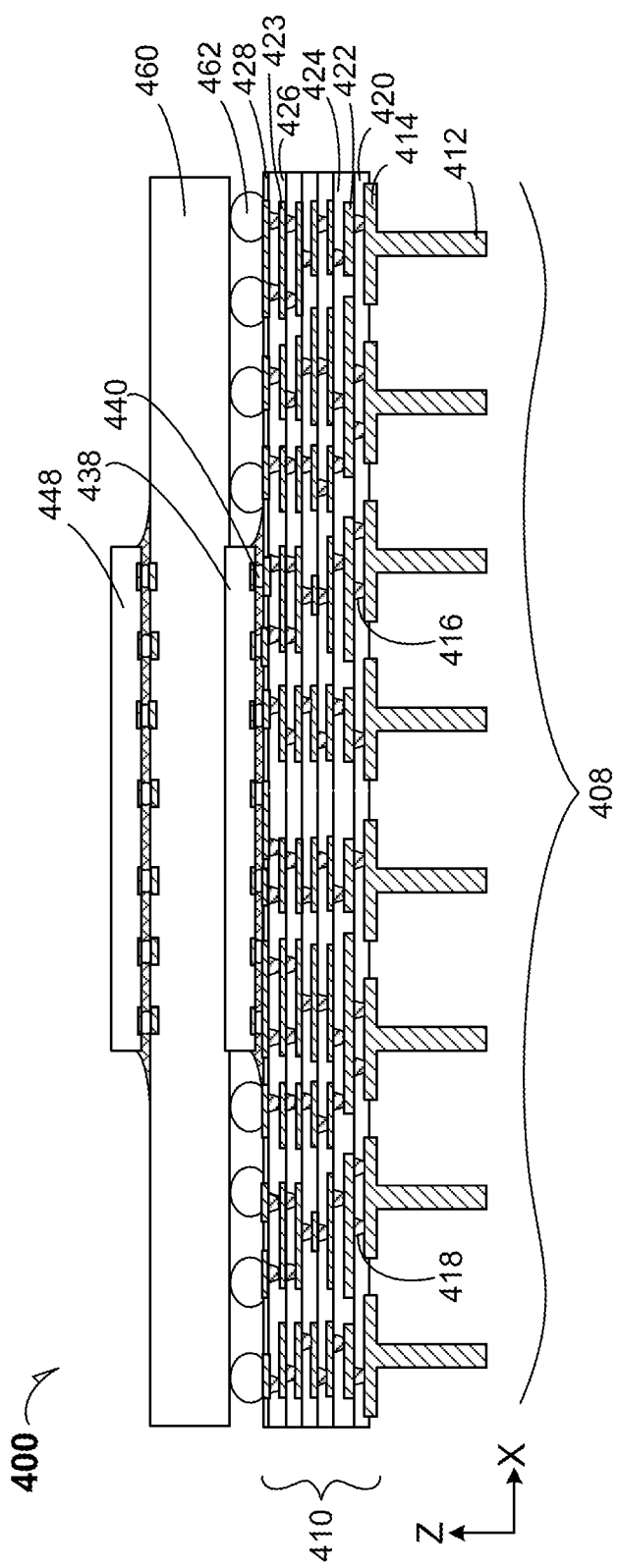
FIG. 4 is a cross-section elevation of a package-on package including a coreless pin-grid array substrate with integral pins according to an example embodiment.

FIG. 4 is a cross-section elevation of a package-on package 400 including a coreless pin-grid array substrate 410 with integral pins 412 according to an example embodiment. A coreless PGA substrate 410 is depicted with a plurality of pins 412. The pins 412 include pin heads 414. As a unit the pins 412 and pin heads 414 are part of the PGA substrate 410 such that the PGA substrate 410 has been manufactured to be an integral structure that includes the pins 412. Expressed another way, no solder is used to couple the pins 412 to the coreless PGA substrate 410. During manufacture of the coreless PGA substrate 410, the pins 412 are fabricated to be an integral part of thereof. As depicted, the pins 412 including the pin heads 414 are attached to the coreless PGA substrate 410 through signal vias 416 as well as power-ground vias 418 similar to the disclosures for the chip package 110 depicted in FIG. 1, the multi-chip package 200 that includes the coreless PGA substrate 210 depicted in FIG. 2, and the stacked-chip coreless PGA substrate package 300 depicted in FIG. 3. A first interlayer 420 encloses the signal- and power/ground vias 416 and 418, respectively, as well as integrates the pin heads 414 therewithin at a pin side of the coreless PGA substrate 410. The coreless PGA substrate 410 is further fabricated at the pins 412 and pin heads 414 with a plurality of traces, one of which is indicated with reference numeral 422. The trace 422 may be referred to as a first-level trace 422 because it is in contact with the first interlayer 420. A second interlayer 424 is manufactured abutting the first interlayer 420. Further build-up of the PGA substrate 410 continues until a subsequent interlayer 426 and a solder mask 428 form a portion of a die side thereof. A subsequent trace 430 is in contact with the subsequent interlayer 426.

The PGA substrate 410 and the PGA 408 are configured as a chip package-on chip package (POP) 400 that supports the microelectronic device 438 such as a processor manufactured by Intel Corporation of Santa Clara, Calif., as well as a POP subsequent microelectronic device 448. In an embodiment, the microelectronic device 438 is coupled to the coreless PGA substrate 410 by a plurality of electrical bumps, one of which is indicated with reference numeral 440, and the POP subsequent microelectronic device 454 is a flip-chip 454 that is mounted with the active surface facing toward a POP substrate 460 that is mounted on the die side of the coreless PGA substrate 410 with POP electrical bumps 462. In an embodiment, the device 438 is a processor and the device 448 is a memory device such as a solid-state drive. It may now be understood that coreless-substrate qualities depicted and described for the coreless substrates 110, 201, and 310 depicted in FIGS. 1, 2, and 3 may be applied to the POP coreless PGA substrate 410 and vice versa. It may now be understood that the coreless PGA substrate 410 may interface with a foundation substrate such as the foundation substrate 190 embodiments illustrated and described in FIG. 1.

Figure 5:
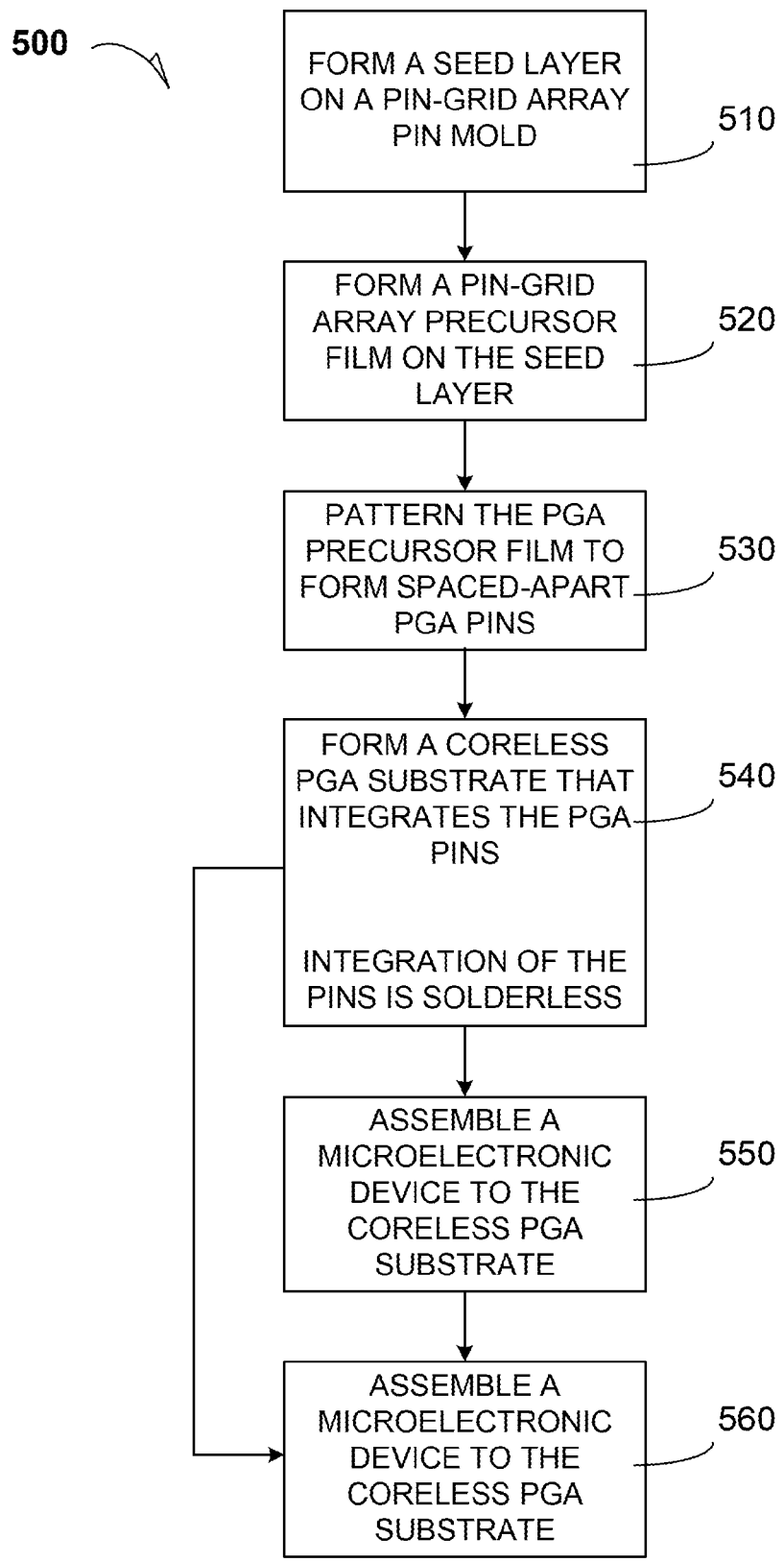
FIG. 5 is a process and method flow diagram according to an example embodiment.

FIG. 5 is a process and method flow diagram 500 according to an example embodiment.

At 510, a process includes forming a seed layer on a PGA pin mold. In a non-limiting example embodiment, the copper seed layer 146 is formed by electroless plating onto the pin mold 142.

At 520, the process includes forming a PGA precursor film on the seed layer. In a non-limiting example embodiment, the seed layer 146 is electrical-grade copper and is used as a cathode to form the pin-grid precursor 150 also of electrical-grade copper.

At 530, the process includes patterning the pin-grid precursor to form individual spaced-apart pins. In a non-limiting example embodiment, the pins 112 are formed by etching the pin-grid precursor according to a pattern.

At 540, the process includes forming a coreless pin-grid array substrate that incorporates the spaced-apart pins as an integral part thereof. In other words, no solder is used to bond the pins to the vias in the coreless PGA substrate. In a non-limiting example embodiment, the first interlayer 120 encloses the signal- and power/ground vias 116 and 118, respectively, as well as integrates the pin heads 114 therewithin at a pin side of the coreless pin-grid array substrate 110. Further processing according to this example embodiment includes forming several interlayers of traces and dielectrics until formation of the subsequent interlayer 126 and solder mask 128 at the die side of the coreless pin-grid array substrate 110. In an embodiment, the process commences at 510 and terminates at 540.

At 550 in a method embodiment, a microelectronic device is assembled to the coreless pin-grid array substrate. In a non-limiting example embodiment, the processor 138 is flip-chip assembled to the coreless pin-grid array substrate 110. In a non-limiting example embodiment, the processor 238 is flip-chip assembled to the multi-chip coreless pin-grid array substrate 210 and the device 248 is wire-bond assembled to the multi-chip coreless pin-grid array substrate 210. In a non-limiting example embodiment, the through-silicon via processor 338 is flip-chip assembled to the coreless pin-grid array substrate 310 and the device 354 is flip-chip bonded to the processor 338 by coupling to a through-silicon via 352. In a non-limiting example embodiment, the subsequent device 448 is POP assembled to the coreless pin-grid array substrate 410. In an embodiment, the process commences at 510 and terminates at 550. In an embodiment, the method commences at 540 and terminates at 550.

Figure 6:
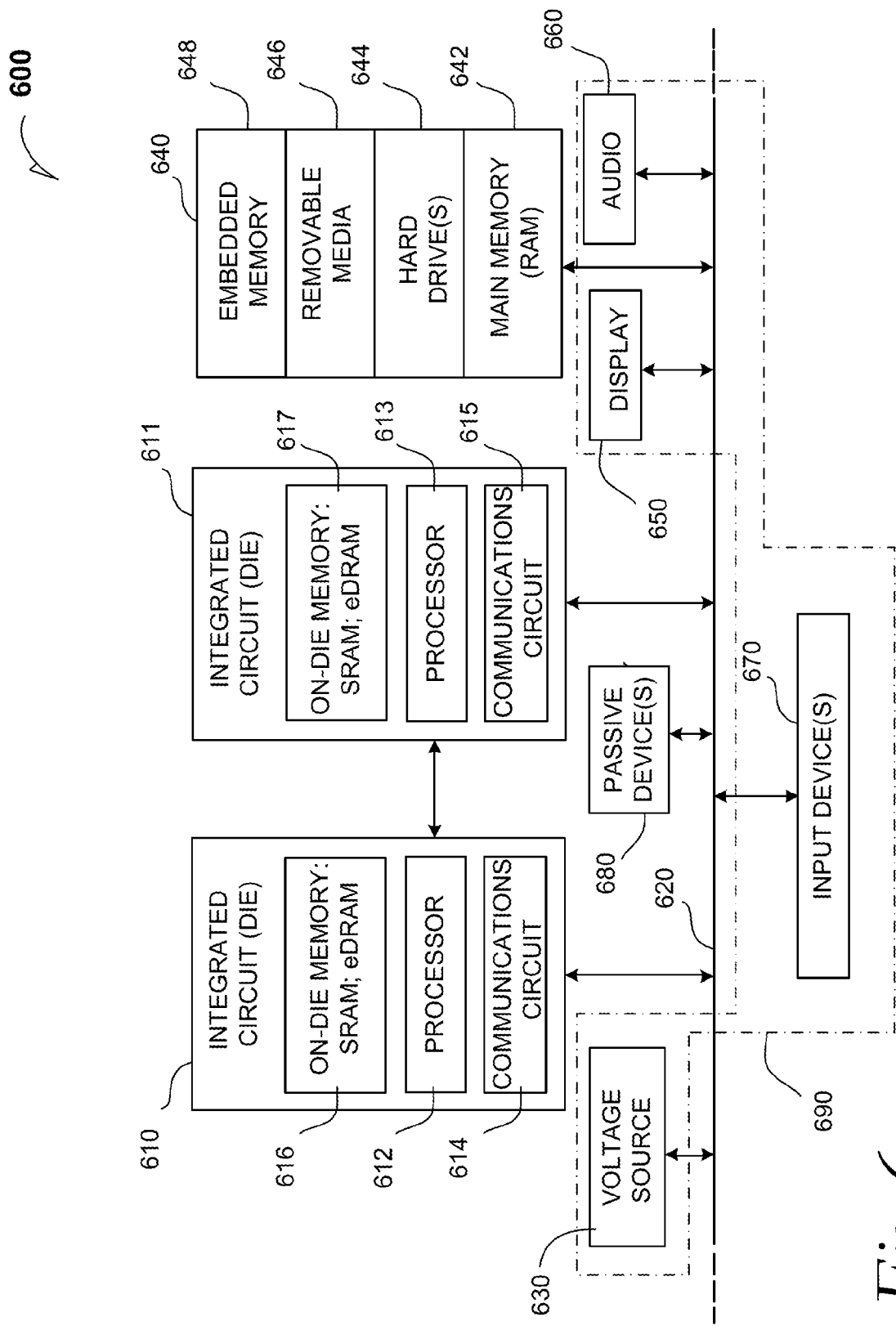
FIG. 6 is a schematic of a computer system according to an embodiment.

At 560 in a method embodiment, the coreless PGA substrate is assembled to a computer system such as any computer system embodiment depicted with respect to FIG. 6.

FIG. 6 is a schematic of a computer system according to an embodiment. The computer system 600 (also referred to as the electronic system 600) as depicted can embody a coreless pin-grid array substrate according to any of the several disclosed embodiments and their equivalents as set forth in this disclosure. An apparatus that includes a coreless pin-grid array substrate that is assembled to a computer system. The computer system 600 may be a mobile device such as a netbook computer. The computer system 600 may be a desktop computer. The computer system 600 may be integral to an automobile. The computer system 600 may be integral to a television. The computer system 600 may be integral to a DVD player. The computer system 600 may be integral to a digital camcorder.

In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type of an apparatus that includes a coreless pin-grid array substrate embodiment. As used herein, the processor 612 may mean any type of circuit such as, but not limited to, a microprocessor, a microcontroller, a graphics processor, a digital signal processor, or another processor. In an embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems. In an embodiment, the processor 610 includes on-die memory 616 such as static random-access memory (SRAM). In an embodiment, the processor 610 includes embedded on-die memory 616 such as embedded dynamic random-access memory (eDRAM).

In an embodiment, the integrated circuit 610 is complemented with a subsequent integrated circuit 611 such as a graphics processor or a radio-frequency integrated circuit or both as set forth in this disclosure. In an embodiment, the dual integrated circuit 610 includes embedded on-die memory 617 such as eDRAM. The dual integrated circuit 611 includes an RFIC dual processor 613 and a dual communications circuit 615 and dual on-die memory 617 such as SRAM. In an embodiment, the dual communications circuit 615 is particularly configured for RF processing.

In an embodiment, at least one passive device 680 is coupled to the subsequent integrated circuit 611 such that the integrated circuit 611 and the at least one passive device are part of the any apparatus embodiment that includes a coreless pin-grid array substrate that includes the integrated circuit 610 and the integrated circuit 611.

In an embodiment, the electronic system 600 includes an antenna element 682 such as any coreless pin-grid array substrate embodiment set forth in this disclosure. By use of the antenna element 682, a remote device 684 such as a television, may be operated remotely through a wireless link by an apparatus embodiment. For example, an application on a smart telephone that operates through a wireless link broadcasts instructions to a television up to about 30 meters distant such as by Bluetooth® technology.

In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. In an embodiment, the external memory 640 is stacked as a TSV chip that has been assembled to a coreless pin-grid array substrate according to any disclosed embodiments. In an embodiment, the external memory 640 is embedded memory 648 such an apparatus that includes a TSV chip mated to a coreless pin-grid array substrate according to any disclosed embodiment.

In an embodiment, the electronic system 600 also includes a display device 650, and an audio output 660. In an embodiment, the electronic system 600 includes an input device such as a controller 670 that may be a keyboard, mouse, touch pad, keypad, trackball, game controller, microphone, voice-recognition device, or any other input device that inputs information into the electronic system 600. In an embodiment, an input device 670 includes a camera. In an embodiment, an input device 670 includes a digital sound recorder. In an embodiment, an input device 670 includes a camera and a digital sound recorder.

A foundation substrate 690 may be part of the computing system 600. In an embodiment, the foundation substrate 690 is a motherboard that supports an apparatus that includes a coreless pin-grid array substrate. In an embodiment, the foundation substrate 690 is part of a blade server that supports an apparatus that includes a coreless pin-grid array substrate. In an embodiment, the foundation substrate 690 is part of a micro server that supports an apparatus that includes a coreless pin-grid array substrate. In an embodiment, the foundation substrate 690 is part of a tablet motherboard that supports an apparatus that includes a coreless pin-grid array substrate. It may be understood that a secondary low-cost package such as a coreless pin-grid array substrate may be part of the computer system 600 as well as a motherboard onto which the secondary low-cost package is assembled. In an embodiment, the foundation substrate 690 is a board which supports an apparatus that includes a coreless pin-grid array substrate. In an embodiment, the foundation substrate 690 incorporates at least one of the functionalities encompassed within the dashed line 690 and is a substrate such as the user shell of a wireless communicator.

As shown herein, the integrated circuit 610 can be implemented in a number of different embodiments, an apparatus that includes a coreless pin-grid array substrate according to any of the several disclosed embodiments and their equivalents, an electronic system, a computer system, one or more methods of fabricating an integrated circuit, and one or more methods of fabricating and assembling an apparatus that includes a coreless pin-grid array substrate according to any of the several disclosed embodiments as set forth herein in the various embodiments and their art-recognized equivalents. The elements, materials, geometries, dimensions, and sequence of operations can all be varied to suit particular I/O coupling requirements including coreless pin-grid array substrate embodiments and their equivalents.

Although a die may refer to a processor chip, an RF chip, an RFIC chip, IPD chip, or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process of forming a coreless pin-grid array substrate comprising:
    forming a seed layer upon a pin-grid array pin mold;
    forming a PGA precursor film on the seed layer;
    patterning the PGA precursor film to achieve a plurality of spaced-apart PGA pins; and
    forming a coreless PGA substrate that integrates the PGA pins including:
        forming a first interlayer to define a land side of the coreless PGA substrate, wherein the first interlayer contacts the PGA pins at pin heads thereof;
        filling a via into the first interlayer, wherein the via makes direct contact with a pin head of the PGA pins; and
        forming a subsequent interlayer to define near a die side of the coreless PGA substrate.

2. The process of claim 1, further including assembling a first microelectronic device to the die side.

3. The process of claim 1, further including assembling a first microelectronic device and a subsequent microelectronic device to the die side.

* * * * *